United States Patent
Inam et al.

(10) Patent No.: US 12,349,324 B1
(45) Date of Patent: Jul. 1, 2025

(54) DIRECT IMPINGEMENT LIQUID COOLING FOR STATIC SYNCHRONOUS SERIES COMPENSATOR SYSTEMS

(71) Applicant: Smart Wires Inc., Union City, CA (US)

(72) Inventors: Haroon Inam, San Jose, CA (US); Ali Farahani, Yorba Linda, CA (US); Mohammad Dehsara, Union City, CA (US)

(73) Assignee: Smart Wires Inc., Durham, NC (US)

( * ) Notice: Subject to any disclaimer, the term of this patent is extended or adjusted under 35 U.S.C. 154(b) by 722 days.

(21) Appl. No.: 17/449,163

(22) Filed: Sep. 28, 2021

Related U.S. Application Data (60) Provisional application No. 63/211,424, filed on Jun. 16, 2021.

(51) Int. Cl.
  *H05K 7/20* (2006.01)
(52) U.S. Cl.
  CPC ..... *H05K 7/20927* (2013.01); *H05K 7/20272* (2013.01)
(58) Field of Classification Search
  CPC ..... H05K 7/14; H05K 7/20927; H02J 3/1807; H02J 3/18
  See application file for complete search history.

(56) References Cited

U.S. PATENT DOCUMENTS

| | | | | |
|---|---|---|---|---|
| 5,841,634 A * | 11/1998 | Visser | ................ | H05K 7/20927 361/689 |
| 6,219,245 B1 * | 4/2001 | Nagashima | ........... | H01L 23/473 257/E23.098 |
| 10,199,150 B2 * | 2/2019 | Carrow | ................. | H02J 3/1814 |
| 11,758,700 B1 * | 9/2023 | Inam | .................. | H05K 7/14339 361/699 |
| 2007/0045801 A1 * | 3/2007 | Sugiyama | ................ | H05K 1/09 257/684 |
| 2008/0123297 A1 * | 5/2008 | Tilton | ................ | H05K 7/20345 361/700 |
| 2014/0252864 A1 * | 9/2014 | Kulkarni | ............ | H05K 7/20936 165/170 |
| 2015/0049437 A1 * | 2/2015 | Broussard | ............... | H01L 23/46 361/699 |
| 2016/0183409 A1 * | 6/2016 | Zhou | ................... | H01L 23/4735 165/104.31 |
| 2019/0006835 A1 * | 1/2019 | Inam | ........................ | H02H 7/16 |
| 2019/0237971 A1 * | 8/2019 | Inam | ..................... | H02J 3/1807 |
| 2022/0039298 A1 * | 2/2022 | Inam | ..................... | H02J 3/1842 |

* cited by examiner

*Primary Examiner* — Adam B Dravininkas
(74) *Attorney, Agent, or Firm* — Womble Bond Dickinson (US) LLP (57) ABSTRACT

A liquid cooling static synchronous series compensator (SSSC) system with series connected inverter valve modules that have liquid cooling blocks is described. The inverter valve modules are operable to inject reactive power into a power transmission line. Inverter valve units are attached to liquid cooling blocks, where there is direct impingement of liquid coolant on an exposed portion of an inverter valve unit in an enclosed fluid chamber. Each liquid cooling block has voltage isolation relative to other liquid cooling blocks. Such voltage isolation may limit ionization of liquid coolant in an SSSC system operating in proximity to high voltages.

20 Claims, 10 Drawing Sheets

DIRECT IMPINGEMENT LIQUID COOLING FOR STATIC SYNCHRONOUS SERIES COMPENSATOR SYSTEMS

CROSS REFERENCE TO RELATED APPLICATIONS

This application claims the benefit of U.S. Provisional Application No. 63/211,424 filed on Jun. 16, 2021, the disclosure of which is incorporated herein by reference.

TECHNICAL FIELD

Embodiments of the disclosure relate to liquid cooled high power semiconductor devices used in a static synchronous series compensator (SSSC) system.

BACKGROUND

A flexible alternating current transmission system (FACTS) provides enhanced controllability and power transfer capability of a high voltage AC transmission system. A static synchronous series compensator (SSSC) is a key component of FACTS. The SSSC injects a leading or lagging voltage into the AC transmission line providing the functionality of a series capacitor or series reactor respectively, i.e., the SSSC pushes power away from or pulls more power towards the circuit on which the SSSC is installed.

The SSSC incorporates a voltage-source converter (VSC) which operates in series with the AC transmission line. The VSC is used to generate and inject an AC voltage in series with the transmission line and if the voltage is in phase quadrature with the transmission line current, the VSC supplies or consumes variable reactive power. The VSC includes switching elements and DC capacitors. The unidirectional voltages of the DC capacitors are converted to an injected AC voltage through control of the switching elements where the injected AC voltage is controlled in magnitude as well as its phase relationship to the AC system voltage. When the injected AC voltage is in phase quadrature with reference to the AC transmission current, leading or lagging, the VSC is used to absorb or supply reactive power. Since the VSC generates an AC voltage from a DC voltage, the VSC is also referred to as an inverter, even though the VSC has the capability to transfer power in either direction.

The VSC includes one or more inverter valve units (IVUs) each having switching elements arranged in a full H-bridge (FHB) configuration. The switching elements include but are not limited to gate-controlled power semiconductor devices, insulated gate bipolar transistors (IGBTs), metal-oxide semiconductor field effect transistors (MOSFETs) or other similar devices. In the case of IGBTs, a diode referred to as a freewheeling diode is placed anti-parallel with the IGBT and conducts current in the opposite direction. The switching elements are connectedly arranged in series where each of the switching elements maintains a portion of the voltage applied to the inverter. A controller provides signals to drive the switching elements.

In an embodiment, IGBTs are the semiconductor devices used for the inverter valve unit. Their transistor characteristics require low drive current, and they provide fast current turn-on and turn-off capability. A high-power switching module increases the current handling capability by combining multiple IGBTs within a packaged module. The high-power switching module includes IGBTs and freewheeling diodes mounted on a ceramic substrate which is attached onto a metal baseplate. The metal baseplate provides mechanical support and heat transfer for the packaged module. For heat transfer the metal baseplate absorbs the heat losses of the IGBT devices and then transmits the heat to an external thermally coupled cooling system.

Thermal management is mandatory to reduce failure of the high-power switching module while operating within its predesigned range, particularly for high voltage systems operating at power exceeding 10,000 watts. High power IGBTs generate significant heat loss, the heat loss can be divided into two categories-conduction loss and switching loss. The conduction losses occur during the on-state voltage drop across the IGBTs depending on the conducted current. The switching power losses occur during on and off stages of the IGBTs depending on the duty cycle and switching frequency.

There are a variety of thermal management options for high-power switching modules including air-cooling which is the simplest with low cost. Air-cooling functions to release the heat to the ambient air by transferring heat from the high-power switching module to a heat sink via the metal baseplate where the heat can be taken away via air convection. Heat sink materials such as arrays or other extruded surfaces with high thermal conductivities like aluminum or copper are used to exchange the heat between the high-power switching module and the ambient air. Air cooling however requires larger physical dimensions since the heat exchange between the heat sink materials and air is mainly dependent on the contact area. Further air cooling adds mechanical constraints requiring the placement of the high-power switching module near the ambient air-exposed heat sink surfaces.

A liquid cooling system offers a more favorable option because liquid cooling generally provides superior cooling efficiency compared to air cooling. Several liquid cooling systems including direct impingement liquid cooling provide high heat transfer and low thermal resistance for the high-power switching module. The liquid coolant may be distilled water mixed with ethylene glycol, or propylene glycol or other liquids having good thermal conduction. The use of water-based cooling however is problematic where the water is in proximity to high voltages (e.g., around 1,500 volts) producing high electric fields which promote ionization of the water. Ionized water in turn will dissolve materials it comes in contact with, potentially causing leaks and fluid blockages within the cooling system as well as other safety and reliability problems.

Conventional SSSCs are ground based systems due to their size and collateral connection requirements They are housed in substantially large metal enclosures and may be installed within a substation building. For ground based SSSCs operating at a lower voltage, such as less than 1,500 volts, there is less concern of water ionization and a liquid cooling system offers a favorable thermal management option compared to air cooling. However, SSSCs operating at a lower voltage require additional electronics and components such as step-up transformers for connection to the transmission line voltage-hence adding costs and potentially reduced system reliability.

Further, transmission distribution lines may be in areas that have land access constraints or other issues that preclude construction of a dedicated substation building due to cost, legal or environmental issues. It is therefore desirable for an SSSC to be installed on transmission towers within the transmission right-of-way or conveniently situated in banks inside or nearby existing substations. SSSCs installed on transmission towers with liquid cooling would offer a preferred thermal management system since they provide higher cooling efficiency with smaller physical dimensions. However, the proximity of high voltages, typically exceeding 1,500 volts is problematic for liquid cooling due to problems related to water ionization. It is under such considerations that present embodiments arise.

SUMMARY

Various embodiments of a liquid cooling system, a liquid cooling block (LCB), and a method of operation of a system are described herein among embodiments of a static synchronous series compensator (SSSC) system, inverter valve modules, inverter valve units, and features and aspects thereof. The embodiments address and provide technological solutions to a technological problem of how to provide thermal management to components of an SSSC system operating in proximity to high voltages.

One embodiment is a liquid cooling static synchronous series compensator system. The system includes one or more series connected inverter valve modules. The inverter valve modules are operable to inject reactive power into a power transmission line. Each inverter valve module includes one or more inverter valve units attached to a liquid cooling block. The liquid cooling block, and the combination of one or more inverter valve units attached to the liquid cooling block, has an enclosed fluid chamber. The liquid cooling block has an aperture to expose a portion of the attached inverter valve unit(s) for direct impingement of liquid coolant in the enclosed fluid chamber. The liquid cooling block has voltage isolation relative to other liquid cooling blocks.

One embodiment is a liquid cooling block, for cooling high-power semiconductor devices in a static synchronous series compensator system. The liquid cooling block has a first section and a second section that, in combination, form an enclosed fluid chamber. The liquid cooling block has a fluid inlet port and a fluid outlet port. The second section of the liquid cooling block has an aperture. This aperture is arranged for the second section to receive a baseplate of one or more high-power switching modules. A portion of the baseplate is exposed to the enclosed fluid chamber through the aperture. The liquid cooling block, with the inverter valve unit(s) so received is to form an inverter valve module. The inverter valve module is series connectable with one or more further inverter valve modules to form the SSSC system. In the SSSC system, the liquid cooling block is to have voltage isolation relative to other liquid cooling blocks of the SSSC system.

One embodiment is a method of operation of a static synchronous series compensator system. The method includes injecting reactive power into a power transmission line, through series connected inverter valve modules. The method includes impinging liquid coolant, in an enclosed fluid chamber of a liquid cooling block, directly onto a portion of each inverter valve unit that is attached to the liquid cooling block, in each inverter valve module. The method includes providing voltage isolation of each liquid cooling block relative to each other liquid cooling block.

DETAILED DESCRIPTION

A liquid cooling block (LCB) is described for cooling high-power semiconductor devices used in a static synchronous series compensator (SSSC) system. The liquid cooling block provides direct impingement where liquid coolant is jetted directly onto a base plate of a high-power switching module. Voltage isolation of the liquid cooling block prevents ionization of the liquid coolant and enables various configurations of series and parallel connected inverter valve units to provide a desired level of injected reactive voltage into a power transmission line.

A static synchronous series compensator injects a leading or lagging voltage into the AC transmission line. The SSSC is housed in a metal enclosure which may be installed on transmission towers within the transmission right-of-way or alternatively inside an existing substation. The SSSC includes one or more inverter valve units (IVUs), which have high-power switching semiconductor devices arranged in a full H-bridge (FHB) configuration. In one embodiment, insulated gate bipolar transistors (IGBTs) are the semiconductor devices used for the inverter valve unit. A high-power switching module allows increasing the current handling capability by combining multiple IGBTs within a packaged module. The high-power switching module includes IGBTs and freewheeling diodes mounted on a ceramic substrate that is attached onto a metal baseplate, in one embodiment. The metal baseplate provides mechanical support and heat transfer for the high-power switching module. An example high-power switching module is the Mitsubishi Electric CM1000DX(P)-24T having a nickel-plated copper metal baseplate.

A first aspect of the present disclosure relates to thermal management of the high-power switching module by way of a liquid cooling block (LCB). A liquid cooling system using the liquid cooling block provides higher cooling efficiency and reduces the physical dimensions of the SSSC. One or more high-power switching modules are mounted onto the liquid cooling block(s) and the use of a liquid cooled system increases the cooling efficiency compared to an air-cooled system. The LCB includes a fluid inlet port, a fluid outlet port and is thermally coupled to a radiator for radiating heat to the ambient air. A pump is used to circulate a liquid coolant within the LCB and the radiator thereby creating a closed-circuit liquid cooling system.

A second aspect of the present disclosure eliminates problems related to water ionization by way of voltage isolation. Each inverter valve unit comprises one or more high-power switching modules mounted onto the liquid cooling block. Voltage isolation of the inverter valve units limits ionization of the liquid coolant and enables combinations of series and parallel connected inverter valve units to provide a desired level of injected reactive voltage into a power transmission line. Since the LCB has no ground connection and the voltages within inverter valve units is maintained at less than 1,500 volts, ionization of the liquid coolant within the liquid cooling block and the closed-circuit fluid system is thereby minimized. To further limit ionization, adjacent inverter valve units are physically spaced apart with an adequate separation distance and insulating materials are used. The insulating materials may include fiber reinforced plastic (FRP) or nylon for example, and the separation distance may be greater than eight (8) mm for example.

The LCB has a planar outside surface and an enclosed fluid chamber. The high-power switching module is mechanically fastened to the planar outside surface, in one embodiment. The enclosed fluid chamber contains the liquid coolant. For direct impingement jets of the liquid coolant impinge directly onto the power electronic module metal baseplate through an aperture in the planar outside surface.

In an embodiment, the liquid cooling block (LCB) is formed via a clamshell construction comprising a first section coupled to a second section enclosing a fluid chamber within. The two LCB sections may be welded, brazed or attached in other ways. The LCB includes a fluid inlet port, a fluid outlet port and is thermally coupled to a radiator for radiating heat to the ambient air. A pump is used to circulate a liquid coolant within the LCB and the radiator thereby creating a closed-circuit liquid cooling system.

For direct impingement, the LCB first section includes a showerhead comprising an array of jetting apertures located inside the enclosed fluid chamber. One or more high-power switching module are mounted on the planar outside surface of the LCB second section. An aperture in the LCB second section allows jets of liquid coolant created by the LCB first section showerhead to impinge directly onto the high-power switching module metal baseplate. A water-resistant seal between the high-power switching module metal baseplate and the aperture in the LCB second half may be applied to prevent leakage of the liquid coolant. This arrangement allowing jets of liquid coolant to impinge directly onto the high-power switching module metal baseplate provides high heat transfer efficiency by eliminating the thermal resistance between the power electronic module and the cooling fluid.

Figure 1:
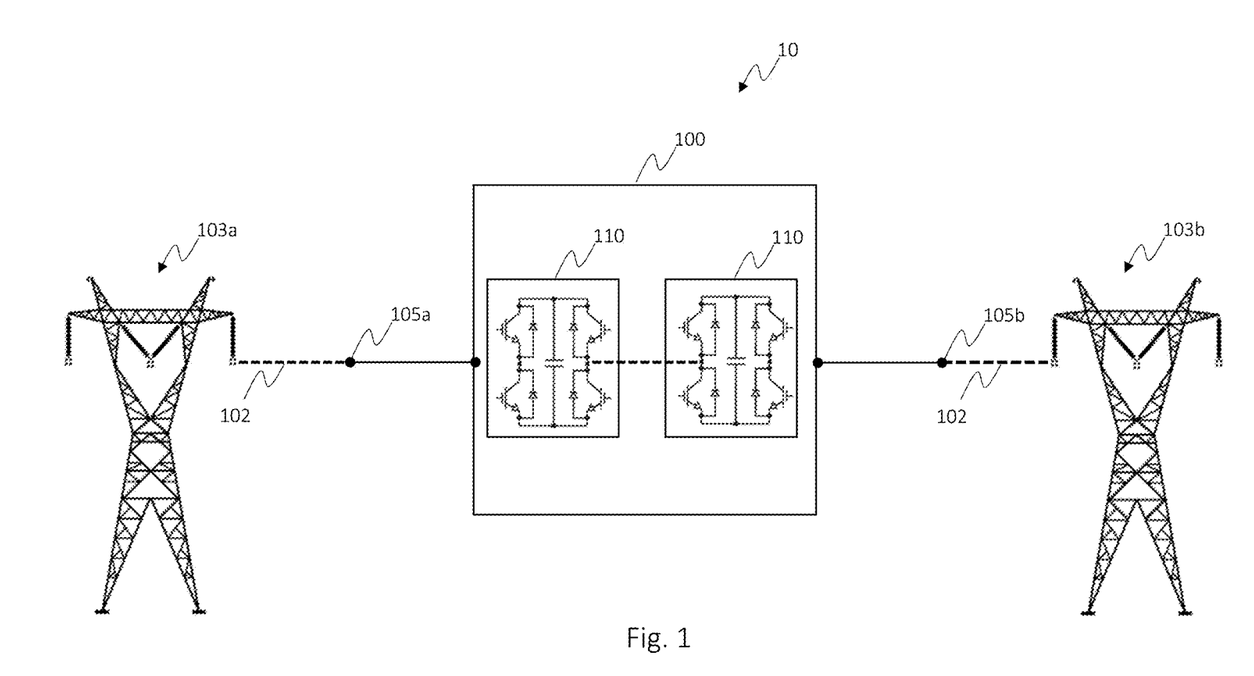
FIG. 1 illustrates an example power transmission system according to an embodiment.

FIG. 1 illustrates an example power transmission system according to an embodiment. In FIG. 1, power transmission system 10 includes a static synchronous series compensator (SSSC) 100, a power transmission line 102, and transmission line towers 103a and 103b. SSSC 100 may be configured to provide 10 MVAr (megavolt amps reactive) of reactive power for injection into power transmission line 102 for example. The SSSC 100 is series connected into power transmission line 102 and may be supported by a transmission line tower 103 within the transmission right-of-way or inside nearby substations. Power transmission line 102 may include a high-voltage transmission line (e.g., as high as 500 kV, kilovolts), a medium-voltage transmission line (e.g., 230 kV) or a distribution line (e.g., 13 kV). The SSSC 100 includes a plurality of inverter valve units (IVUs) 110 operatively connected in series and parallel combinations to provide a desired level of injected reactive voltage into power transmission line 102. Terminals 105a and 105b are shown for connecting the SSSC 100 to the power transmission line 102.

Figure 2:
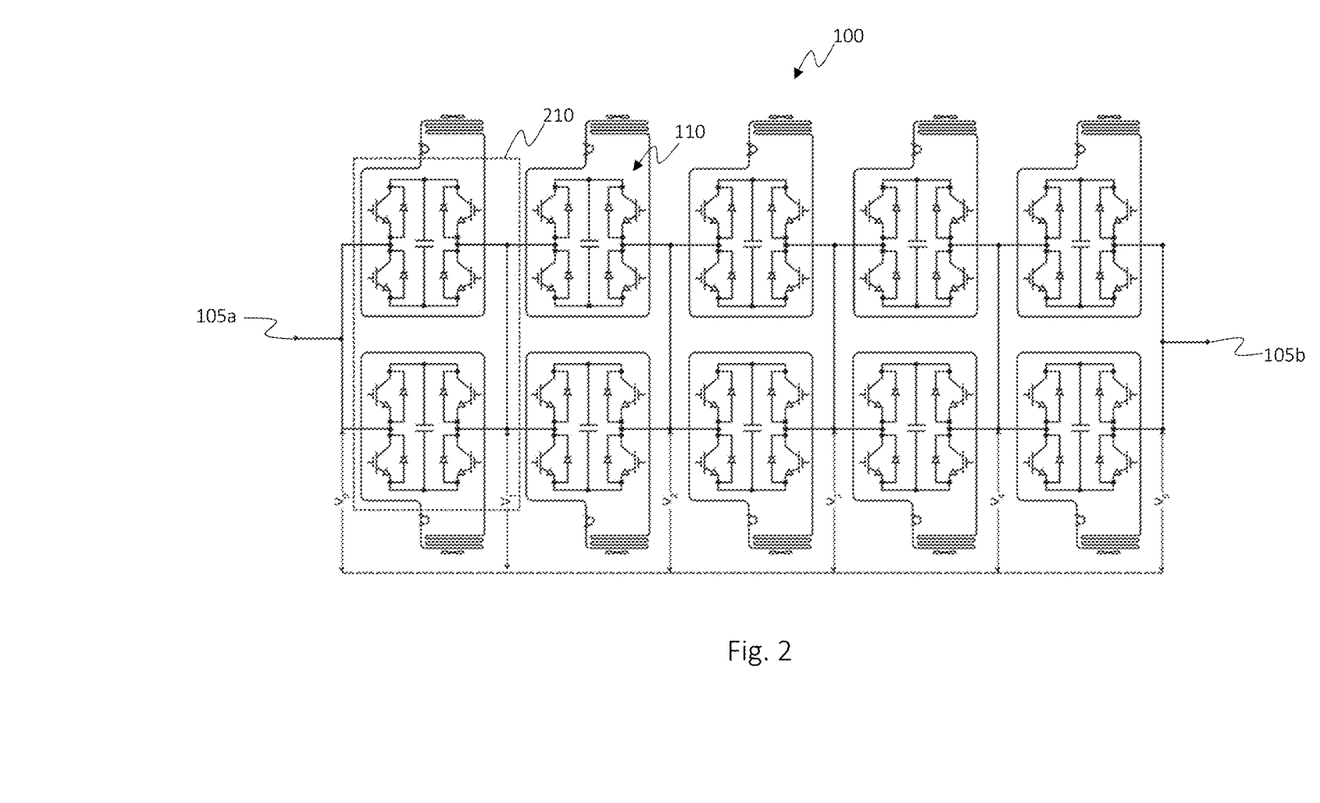
FIG. 2 is a block diagram illustrating an example static synchronous series compensator according to an embodiment.

FIG. 2 is a block diagram illustrating an example static synchronous series compensator. Referring to FIG. 2, SSSC 100 injects a leading or lagging voltage into the power transmission line 102, through terminals 105a and 105b. The SSSC 100 includes a plurality of inverter valve units 110 operatively connected in series and parallel to provide a desired level of injected reactive voltage into power transmission line 102. The embodiment shown in FIG. 2 includes ten inverter valve units 110, though SSSC 100 may include more or less than ten inverter valve units 110, connected in various series and parallel combinations in some embodiments.

In the embodiment shown in FIG. 2, SSSC 100 includes 5 series connected inverter valve modules 210, each injecting reactive power into the power transmission line 102, 0.8 kV for example, though this voltage may be greater in other embodiments. Each inverter valve module 210 comprises two parallel connected inverter valve units 110 where the two parallel connected inverter valve units 110 are used to increase the injected current. Further SSSC embodiments could have fewer or more series connected inverter valve modules 210, for example ten series connected inverter valve modules 210 for a total of twenty inverter valve units 110 in an SSSC.

The input potential at the first inverter valve module is shown as node V0, and the output potential is shown as node V1. Each voltage V1, V2, V3, V4, V5, exceeds a prior voltage level by the amount of voltage injection by each inverter valve module 210, 0.8 kV for example. The series connection of the inverter valve modules 210 is required to achieve the desired level of injection of reactive power into the power transmission line 102 connected at terminals 105a and 105b. At node V5, the level of injected reactive power into the power transmission line 102 is 5×0.8 kV in this example.

Figure 3:
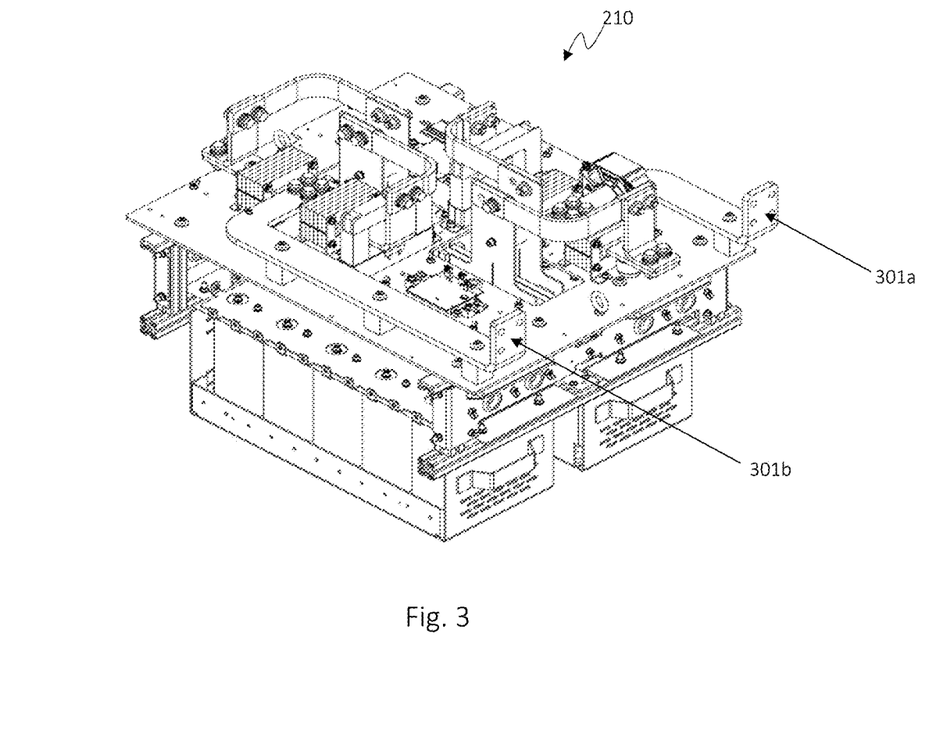
FIG. 3 is a perspective view of an inverter valve module according to an embodiment.

FIG. 3 is a perspective view of an inverter valve module according to an embodiment. Terminals 301a and 301b denote connection points for the input potential, e.g., node V0, and the output potential, e.g., node V1.

Figure 4:
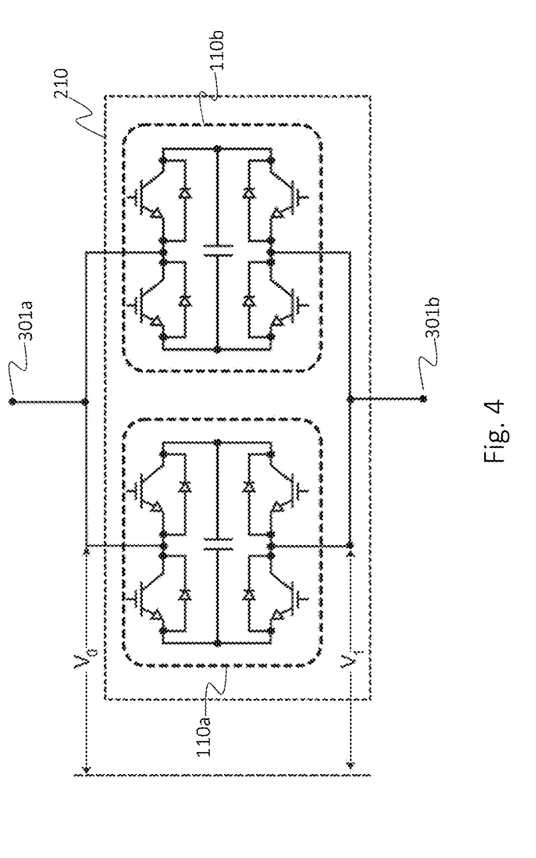
FIG. 4 is a simplified block diagram illustrating an inverter valve module according to an embodiment.

FIG. 4 is a simplified block diagram illustrating an inverter valve module according to an embodiment. In FIG. 4, inverter valve module 210 includes two parallel connected inverter valve units 110a and 110b, though one or more than two inverter valve units 110 connected in parallel may be used in some embodiments. The capacitors shown in the figure represent a bank of DC capacitors. Terminals 301a and 301b denote connection points for the input potential, e.g., node V0, and the output potential, e.g., node V1, respectively. At node V1, the level of injected reactive power is 0.8 kV in this example, though this voltage may be greater in other embodiments.

Figure 5:
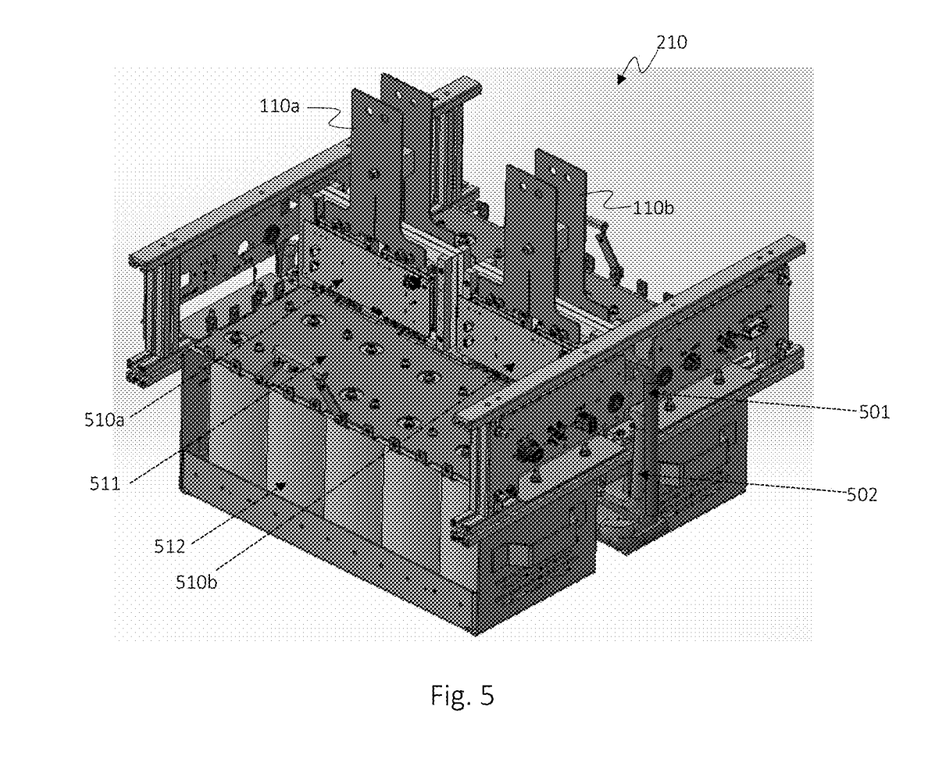
FIG. 5 illustrates a partially disassembled an inverter valve module according to an embodiment.

FIG. 5 illustrates a partially disassembled inverter valve module according to an embodiment. In FIG. 5, inverter valve module 210 includes two parallel connected inverter valve units 110a and 110b. Inlet tube 501 and outlet tube 502 carry liquid coolant to the LCBs fluid inlet and outlet ports that are hidden behind printed circuit boards 510a and 510b, with each circuit board 510a and 510b having control circuits for the high-power switching modules associated with the corresponding inverter valve unit. Capacitor bank 512 and DC bus 511 are also shown. The inverter valve module 210 may include structural members fabricated using non-electrically conductive materials such as fiber reinforced plastic (FRP). One version of FRP comprises a polyester resin and has an operating temperature up to around 140° F., for example. Another version of FRP comprises an epoxy resin and has an operating temperature up to around 240° F., as an example. Although not required for voltage isolation, the tubing for circulating the coolant may comprise a non-electrically conductive material such as silicone.

Figure 6:
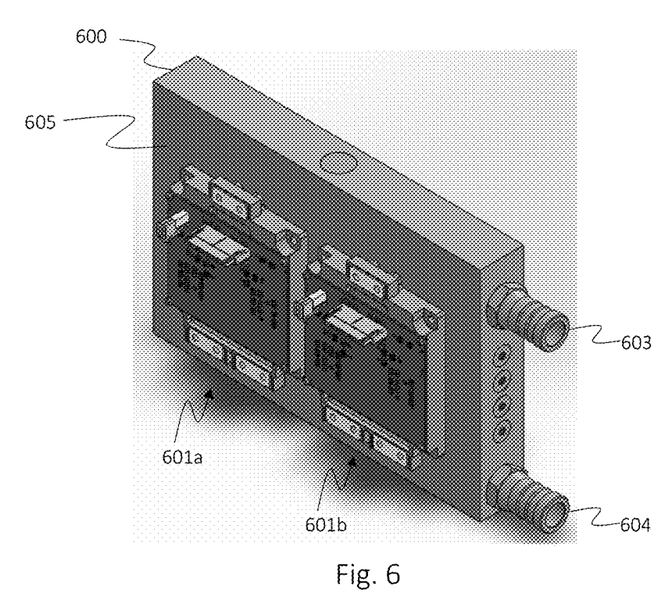
FIG. 6 illustrates a partially disassembled inverter valve unit (IVU) according to an embodiment.

FIG. 6 illustrates a partially disassembled inverter valve unit 110. In FIG. 6, two high-power switching modules 601a and 601b are mechanically fastened to the liquid cooling block (LCB) 600 planar outside surface 605. A suitable example of a high-power switching module is the Mitsubishi Electric CM1000DX(P)-24T having a nickel-plated copper metal baseplate. A fluid inlet port 603 and a fluid outlet port 604 are also shown.

Figure 7:
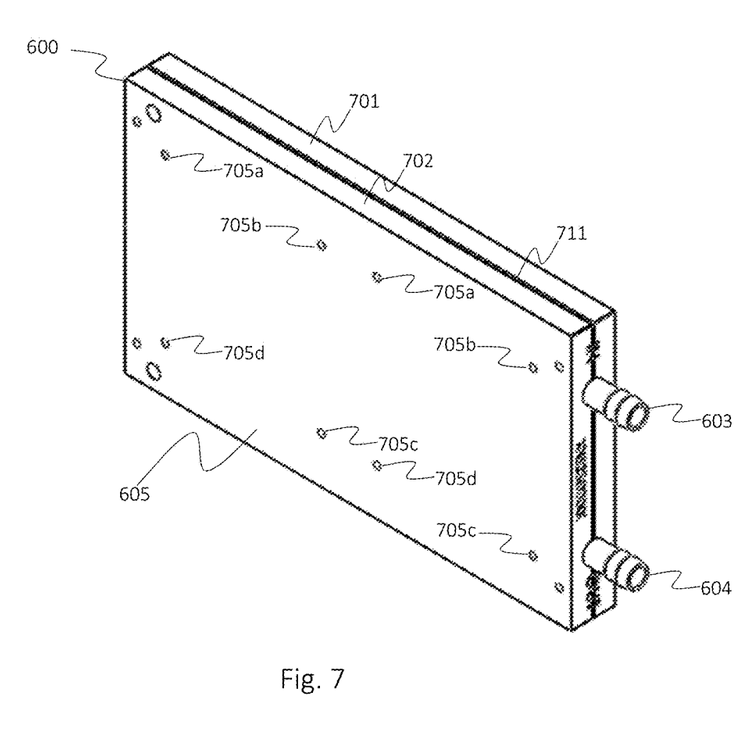
FIG. 7 illustrates an example liquid cooling block (LCB) according to an embodiment.

FIG. 7 illustrates a liquid cooling block (LCB) according to an embodiment. In FIG. 7, LCB 600 has a clam shell construction, a first section 701 and a second section 702, which may be welded together to form interface 711. Each section of the LCB 600 is accessible for machining a shaped internal cavity to form an enclosed fluid chamber. A fluid inlet port 603 and a fluid outlet port 604 are shown. The planar outside surface 605 is located on the second section 702. Two sets of four threaded mounting holes, 705a, 705b, 705c and 705d are provided for fastening the high-power switching modules. An alternative manufacturing method is to fabricate a liquid cooling block using polymer material including metal plates at the thermal interfaces.

Figure 8:
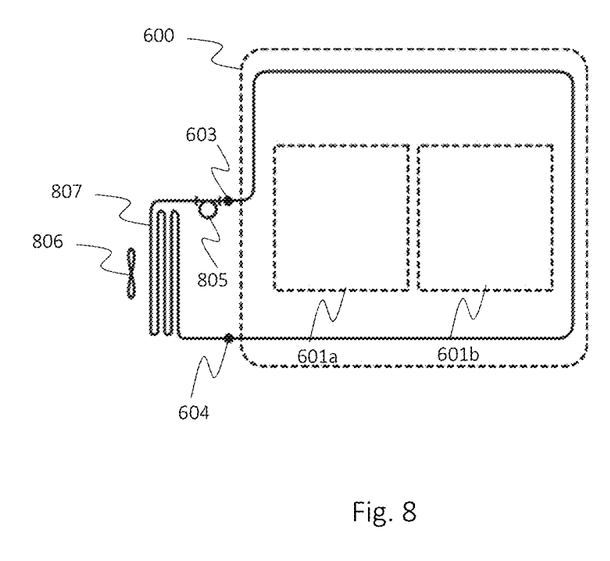
FIG. 8 illustrates an example closed-circuit liquid cooling system according to an embodiment.

FIG. 8 illustrates an example closed-circuit liquid cooling system according to an embodiment. In FIG. 8, LCB 600 includes a fluid inlet port 603 and a fluid outlet port 604 coupled to the closed-circuit liquid cooling system. A pump 805 is used to circulate a liquid coolant within the closed-circuit liquid cooling system. The LCB 600 is thermally coupled to one or more fans 806 and a radiator 807 for radiating heat to the ambient air. Some embodiments have redundant fans 806. The liquid coolant may be a combination of one or more of distilled water, de-ionized water. ethylene glycol, and polyethylene glycol for example, although any suitable liquid coolant may be used. The liquid coolant may have an operating pressure (less than 2 bar for example) and may be compatible with an operating temperature (e.g., –40° C. to 50° C.). The amount of liquid coolant required for an inverter stage may be less than 10 liters for example, but may be more or less in other embodiments. The liquid coolant may be replaceable or may be contained in a sealed manner that does not require replacement.

Figure 9:
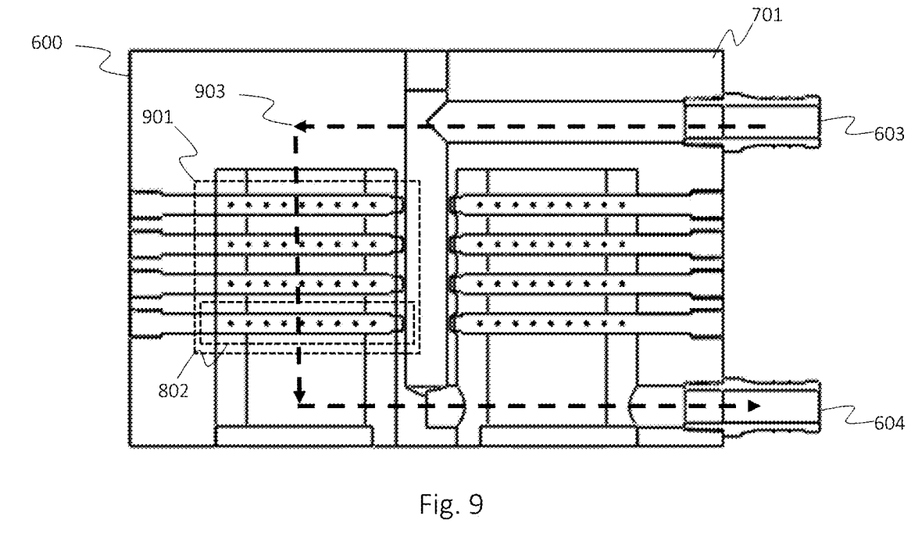
FIG. 9 illustrates a cross-section view and flow of liquid coolant inside the LCB according to an embodiment.

FIG. 9 illustrates a cross-section and flow of the liquid coolant inside an LCB according to an embodiment. Referring to FIG. 9, LCB first section 701 of LCB 600 includes a showerhead 901 located inside the fluid chamber. Liquid coolant entering the fluid inlet port 603 is routed to a showerhead 901. Each showerhead 901 includes an array of jetting apertures comprising one or more rows 802 of jetting apertures and 9 (nine) jetting apertures per row 802 as an example. Arrows 903 depict the directional flow of the liquid coolant.

Figure 10:
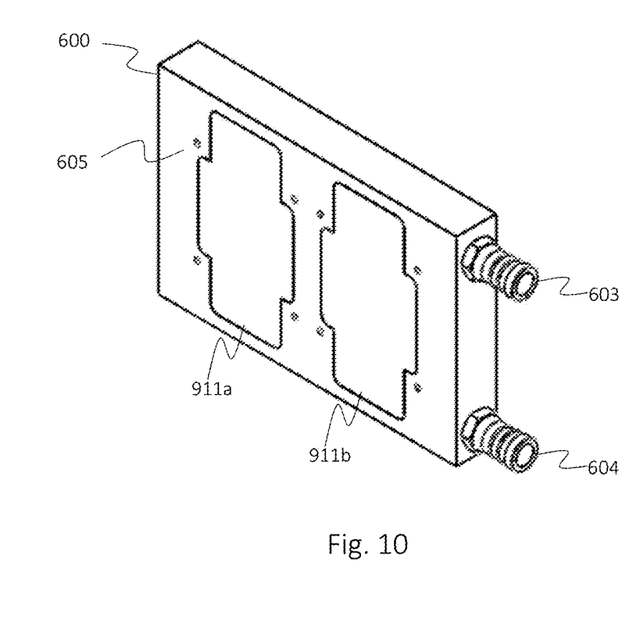
FIG. 10 illustrates an LCB configured for direct impingement according to an embodiment.

FIG. 10 illustrates an LCB configured for direct impingement according to an embodiment. Referring to FIG. 10, one or more high-power switching modules 601 are mechanically fastened on planar outside surface 605 of LCB 600. Apertures 911a and 911b in the LCB second section 702 allows jets of liquid coolant created by the LCB first section 701 showerhead 901 to impinge directly onto the high-power switching module 601a and 601b metal baseplate, respectively. After jets of the liquid coolant have impinged onto the power electronic module metal baseplate, the liquid coolant is routed to the fluid outlet port 604. A water-resistant seal between the high-power switching module 601 metal baseplate and the aperture in the LCB 600 may be applied to prevent leakage of the liquid coolant.

The teachings contained in the embodiments described herein may be applied to stand-alone high-power switching modules, inverters, voltage source converters and static synchronous series compensator systems. The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described to best explain the principles of the embodiments and its practical applications, to thereby enable others skilled in the art to best utilize the embodiments and various modifications as may be suited to the particular use contemplated. Accordingly, the embodiments described herein are to be considered as illustrative and not restrictive, and the invention is not to be limited to the details given herein but may be modified within the scope and equivalents of the appended claims.

What is claimed is:

1. A liquid cooling static synchronous series compensator (SSSC) system, comprising:
   one or more series connected inverter valve modules operable to inject reactive power into a power transmission line of a high-voltage power transmission system, each inverter valve module including a plurality of inverter valve units attached to a liquid cooling block (LCB) having an enclosed fluid chamber; and
   the liquid cooling block having an aperture to expose a portion of each of the plurality of inverter valve units for direct impingement of liquid coolant in the enclosed fluid chamber, wherein adjacent inverter valve units of the plurality of inverter valve units are spaced apart with first insulating materials such that the liquid cooling block has voltage isolation relative to other liquid cooling blocks of the SSSC system.

2. The liquid cooling SSSC system of claim 1, wherein:
   each liquid cooling block has no ground connection and the liquid cooling block and the other liquid cooling blocks are spaced apart with second insulating materials.

3. The liquid cooling SSSC system of claim 1, wherein at least one inverter valve module includes a plurality of liquid cooling blocks.

4. The liquid cooling SSSC system of claim 1, wherein the liquid cooling block has a clam shell construction forming the enclosed fluid chamber, including a first section and a second section having the aperture.

5. The liquid cooling SSSC system of claim 1, wherein the liquid cooling block comprises:
   a fluid inlet port;
   a fluid outlet port; and
   a planar outside surface having the aperture.

6. The liquid cooling SSSC system of claim 5, wherein one or more high-power switching modules are attached to a planar outside surface of the liquid cooling block with a baseplate of the one or more high-power switching modules exposed through the aperture to the enclosed fluid chamber.

7. The liquid cooling SSSC system of claim 1, wherein the liquid cooling block comprises a showerhead having an array of jetting apertures, inside the enclosed fluid chamber.

8. The liquid cooling SSSC system of claim 1, further comprising:
   one or more high-power switching modules having a baseplate; and the liquid cooling block having at least one jetting aperture to impinge at least one jet of the liquid coolant onto the baseplate through the aperture of the liquid cooling block.

9. A liquid cooling block (LCB) for cooling high-power semiconductor devices in a static synchronous series compensator (SSSC) system, the LCB comprising:
a first section and a second section, forming an enclosed fluid chamber;
a fluid inlet port;
a fluid outlet port; and
the second section having an aperture arranged for the second section to receive a baseplate of one or more high-power switching modules of each inverter valve unit of a plurality of inverter valve units, with a portion of the baseplate exposed to the enclosed fluid chamber through the aperture;
wherein the liquid cooling block and the plurality of inverter valve units form an inverter valve module that is series connectable with one or more further inverter valve modules to form the SSSC system; and
wherein, in the formed SSSC system, adjacent inverter valve units of the plurality of inverter valve units are spaced apart with insulating materials such that the liquid cooling block has voltage isolation relative to other liquid cooling blocks of the SSSC system.

10. The LCB of claim 9, further comprising a clam shell construction that includes the first section and the second section.

11. The LCB of claim 9, further comprising:
a showerhead having an array of jetting apertures arranged to provide a plurality of jets of liquid coolant for direct impingement on the portion of the baseplate of the one or more high-power switching modules, in the enclosed fluid chamber.

12. The LCB of claim 9, further comprising:
a showerhead having one or more rows of jetting apertures arranged to provide a plurality of jets of liquid coolant for direct impingement on the portion of the baseplate of the one or more high-power switching modules, in the enclosed fluid chamber.

13. The LCB of claim 9, further comprising:
the first section having at least one aperture to provide at least one jet of liquid in the enclosed fluid chamber for direct impingement on the baseplate of the one or more high-power switching modules.

14. A method of operation of a static synchronous series compensator (SSSC) system, the method comprising:
injecting reactive power into a power transmission line of a high-voltage power transmission system, through a plurality of series connected inverter valve modules;
impinging liquid coolant, in an enclosed fluid chamber of a liquid cooling block, directly onto a portion of each of a plurality of inverter valve units attached to the liquid cooling block, in each of the plurality of series connected inverter valve modules; and
providing voltage isolation of each liquid cooling block relative to each other liquid cooling block by spacing adjacent inverter valve units of the plurality of inverter valve units of each of the plurality of series connected inverter valve modules apart with first insulating materials.

15. The method of claim 14, wherein the providing the voltage isolation further comprises:
providing voltage isolation to each inverter valve module relative to each other inverter valve module, except for series connection of inverter valve modules.

16. The method of claim 14, wherein the impinging the liquid coolant directly onto the portion of each of the one or more inverter valve units comprises providing a plurality of jets of the liquid coolant through a showerhead onto a baseplate of each of the one or more high-power switching modules.

17. The method of claim 14, wherein the impinging the liquid coolant directly onto the portion of each of the one or more inverter valve units comprises providing a plurality of jets of the liquid coolant through an array of jetting apertures onto the portion of each of the one or more inverter valve units.

18. The method of claim 14, wherein the impinging the liquid coolant directly onto the portion of each of the one or more inverter valve units comprises providing, inside the enclosed fluid chamber, a plurality of jets of the liquid coolant through one or more rows of jetting apertures and through an aperture of the liquid cooling block onto the portion of each of the one or more inverter valve units.

19. The method of claim 14, further comprising:
limiting ionization of the liquid coolant through the voltage isolation of each liquid cooling block, which includes the liquid cooling block having no ground connection and spacing apart liquid cooling blocks with second insulating materials.

20. The method of claim 14, further comprising:
maintaining voltages within each of the one or more inverter valve units at less than 1500 volts.

* * * * *